(12) United States Patent
Hsieh et al.

(10) Patent No.: US 12,278,173 B2
(45) Date of Patent: Apr. 15, 2025

(54) ELECTRONIC PACKAGE AND SUBSTRATE STRUCTURE THEREOF

(71) Applicant: SILICONWARE PRECISION INDUSTRIES CO., LTD., Taichung (TW)

(72) Inventors: Wen-Chen Hsieh, Taichung (TW);
Ya-Ting Chi, Taichung (TW);
Chia-Wen Tsao, Taichung (TW);
Hsin-Yin Chang, Taichung (TW);
Yi-Lin Tsai, Taichung (TW);
Hsiu-Fang Chien, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 510 days.

(21) Appl. No.: 17/859,291

(22) Filed: Jul. 7, 2022

(65) Prior Publication Data

US 2023/0343692 A1    Oct. 26, 2023

(30) Foreign Application Priority Data

Apr. 26, 2022 (TW) .................................. 111115837

(51) Int. Cl.
*H01L 23/498* (2006.01)
*H01L 21/56* (2006.01)
(Continued)

(52) U.S. Cl.
CPC .... *H01L 23/49838* (2013.01); *H01L 23/3135* (2013.01); *H01L 23/49811* (2013.01);
(Continued)

(58) Field of Classification Search
CPC ......... H01L 23/49838; H01L 23/49811; H01L 23/3135; H01L 23/3121; H01L 23/3128;
(Continued)

(56) References Cited

U.S. PATENT DOCUMENTS

2006/0076695 A1* 4/2006 Hsieh ............... H01L 21/565
257/E23.125

FOREIGN PATENT DOCUMENTS

TW          519739 B  *  2/2003  .......... H01L 21/565

OTHER PUBLICATIONS

Substrate-type Semiconductor Encapsulation Process Capable of Preventing Flash. 2023.*

* cited by examiner

*Primary Examiner* — Jasmine J Clark
(74) *Attorney, Agent, or Firm* — Dority & Manning, P.A.

(57) ABSTRACT

An electronic package is provided and includes a substrate structure, an electronic element disposed on the substrate structure and an encapsulation layer encapsulating the electronic element, where at least one functional circuit is formed on a surface of a substrate body of the substrate structure, and a wire having a smaller width is arranged on a boundary line at a junction between an encapsulation area and a peripheral area, so that when a mold for forming the encapsulation layer is formed to cover the substrate structure, the mold will create a gap around the wire to serve as an exhaust passage. Therefore, when the encapsulation layer is formed, the exhaust passage can be used to exhaust air, so as to avoid problems such as the occurrence of voids or overflows of the encapsulation layer.

20 Claims, 6 Drawing Sheets

(51) Int. Cl.
*H01L 23/00* (2006.01)
*H01L 23/31* (2006.01)

(52) U.S. Cl.
CPC ............. *H01L 24/16* (2013.01); *H01L 24/32* (2013.01); *H01L 24/73* (2013.01); *H01L 21/563* (2013.01); *H01L 21/565* (2013.01); *H01L 2224/16227* (2013.01); *H01L 2224/16238* (2013.01); *H01L 2224/26175* (2013.01); *H01L 2224/32225* (2013.01); *H01L 2224/73204* (2013.01); *H01L 2924/3511* (2013.01); *H01L 2924/35121* (2013.01); *H01L 2924/37001* (2013.01)

(58) Field of Classification Search
CPC ... H01L 23/481; H01L 23/5286; H01L 24/16; H01L 24/49; H01L 24/73; H01L 2924/3511; H01L 2924/35121; H01L 2924/37001; H01L 21/565
USPC ........................................................ 257/127
See application file for complete search history.

ELECTRONIC PACKAGE AND SUBSTRATE STRUCTURE THEREOF

BACKGROUND

1. Technical Field

The present disclosure relates to a semiconductor device, and more particularly, to an electronic package that can improve yield and a substrate structure thereof.

2. Description of Related Art

With the development of the electronic industry, today's electronic products have tended to be designed in the direction of light, thin, short, and diversified functions, and the semiconductor packaging technology has also developed different packaging types. In order to meet the high integration and miniaturization requirements of semiconductor devices, in addition to the conventional wire bonding semiconductor packaging technology, the industry mainly uses the flip chip method to improve the wiring density of semiconductor devices.

Figure 1A:
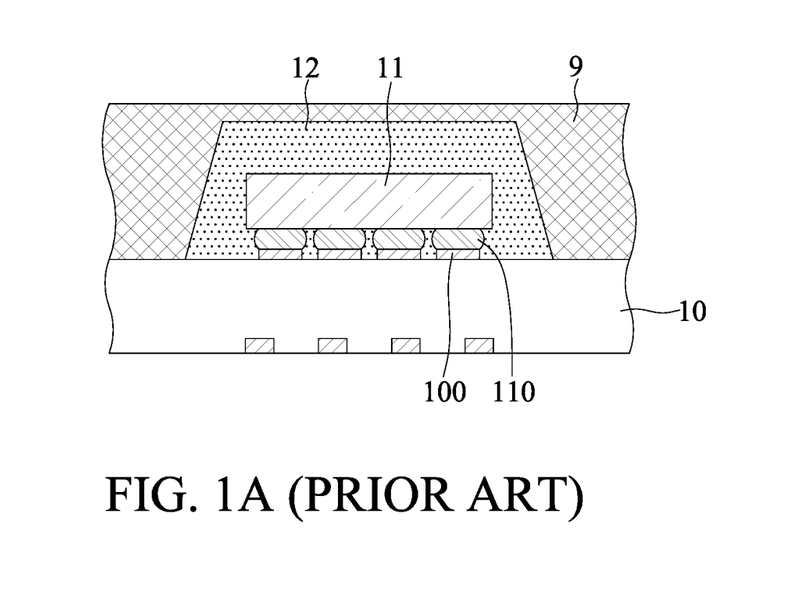
FIG. 1A is a schematic cross-sectional view of a conventional semiconductor package in a manufacturing process.

FIG. 1A is a schematic cross-sectional view of a conventional flip-chip semiconductor package 1. As shown in FIG. 1A, a semiconductor chip 11 is first bonded onto a plurality of electrical contact pads 100 of a package substrate 10 via a plurality of solder bumps 110, and then the solder bumps 110 are reflowed. Next, an encapsulant 12 is formed on the package substrate 10 via a mold 9 to encapsulate the semiconductor chip 11 and the solder bumps 110.

Figure 1B:
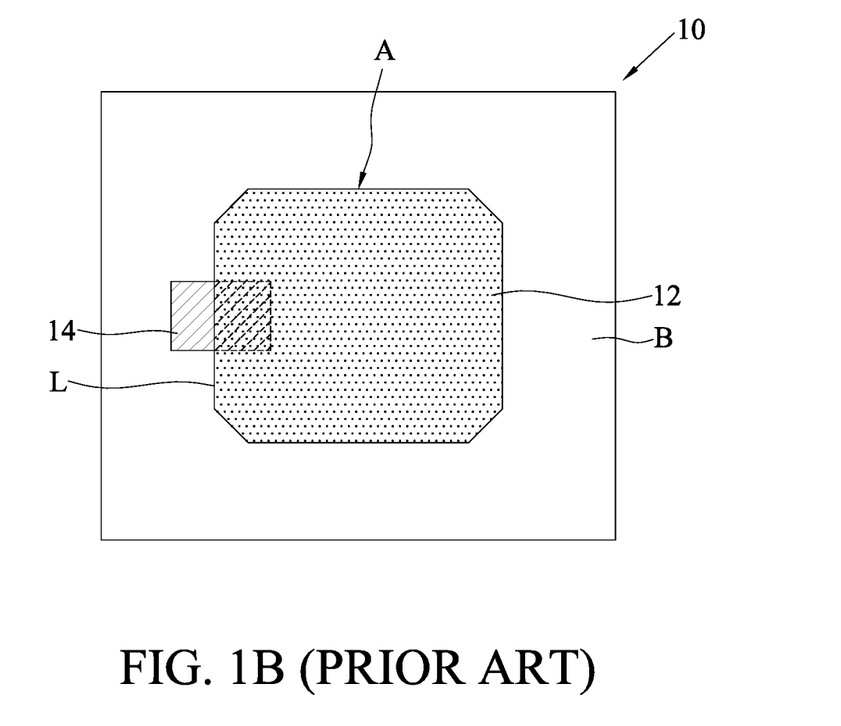
FIG. 1B is a schematic top view of the conventional semiconductor package.

As shown in FIG. 1A and FIG. 1B, the package substrate 10 generally defines an encapsulation area A for forming the encapsulant 12 and a peripheral area B surrounding the encapsulation area A, and at least one sheet-shaped grounding circuit 14 electrically connected to the semiconductor chip 11 is usually arranged on the package substrate 10, so that the sheet-shaped grounding circuit 14 is extended from the encapsulation area A to the peripheral area B.

However, in the conventional semiconductor package 1, the sheet-shaped grounding circuit 14 is a large-area metal structure, so that a boundary line L at the junction between the encapsulation area A and the peripheral area B has a large area occupying a section of that boundary line L. Therefore, when the mold 9 is covered on the package substrate 10, there is no gap between the mold 9 and the sheet-shaped grounding circuit 14, so that when the encapsulant 12 is formed, it is easy to cause voids or overflows of the encapsulant 12 at and around the sheet-shaped grounding circuit 14 due to poor air exhaust, resulting in the problem of popcorn or delamination of the semiconductor package 1, thereby resulting in poor production yield.

Therefore, how to overcome the above-mentioned drawbacks of the prior art has become an urgent issue to be solved at present.

SUMMARY

In view of the various deficiencies of the prior art, the present disclosure provides a substrate structure, comprising: a substrate body defined with an encapsulation area and a peripheral area adjacent to each other on a surface of the substrate body; and at least one functional circuit formed on the substrate body and extending from the encapsulation area to the peripheral area, wherein the functional circuit is defined with a first block located on the encapsulation area, a second block located on the peripheral area, and at least one wire connecting the first block and the second block, and wherein the wire has a width less than a width of the first block.

The present disclosure also provides an electronic package, comprising: the aforementioned substrate structure; an electronic element disposed on the encapsulation area and electrically connected to the functional circuit; and an encapsulation layer formed on the encapsulation area but not on the peripheral area.

In the aforementioned electronic package and the substrate structure thereof, the width of the wire is 100 micrometers to 150 micrometers. For example, the width of the wire is 130 micrometers.

In the aforementioned electronic package and the substrate structure thereof, the width of the wire is less than or equal to a width of the second block.

In the aforementioned electronic package and the substrate structure thereof, the wire spans a boundary line at a junction between the encapsulation area and the peripheral area, such that the wire defines a first line segment arranged in the encapsulation area and a second line segment arranged in the peripheral area based on the boundary line. For example, the first line segment is connected to the first block, and the second line segment is connected to the second block. Alternatively, the first line segment has a length of 130 micrometers to 160 micrometers, and the second line segment has a length of 130 micrometers to 160 micrometers.

In the aforementioned electronic package and the substrate structure thereof, the functional circuit is a grounding circuit.

In the aforementioned electronic package and the substrate structure thereof, the substrate body is configured with metal layers on the peripheral area, and wherein the metal layers are spaced apart from the wire and are free from being electrically connected to the wire.

It can be seen from the above that, in the electronic package and its substrate structure of the present disclosure, through the design of the functional circuit, the functional circuit is arranged on the boundary line at the junction between the encapsulation area and the peripheral area with the wire having a smaller width, so that when the mold for forming the encapsulation layer is covered on the substrate structure, the mold will create a gap around the wire for use as an exhaust passage. Therefore, compared with the prior art, when the encapsulation layer is formed, the exhaust passage can be used to exhaust air to increase the exhaust volume, so as to avoid the occurrence of voids or overflows in the encapsulation layer, and thus avoid problems such as popcorn or delamination of the electronic package.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 2A:
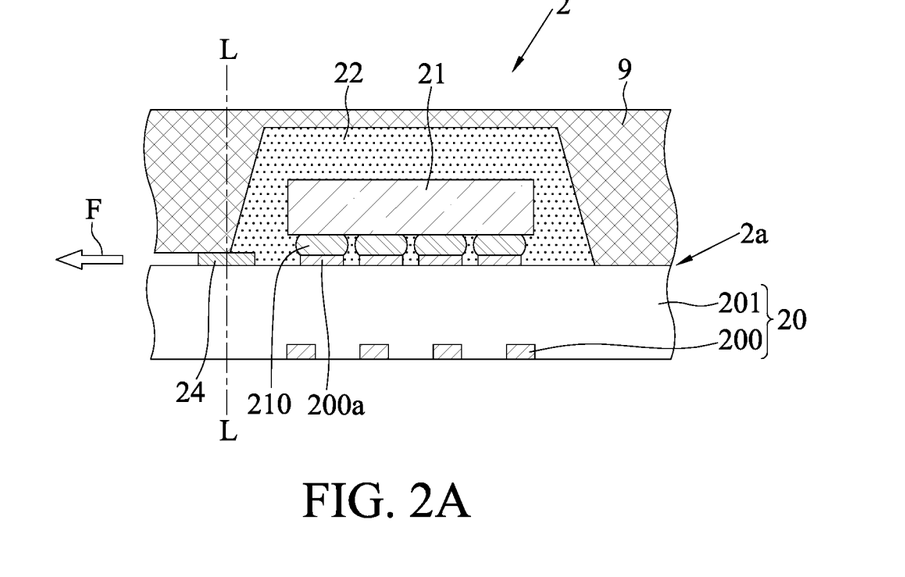
FIG. 2A is a schematic cross-sectional view of an electronic package according to the present disclosure in a manufacturing process.
Figure 2B:
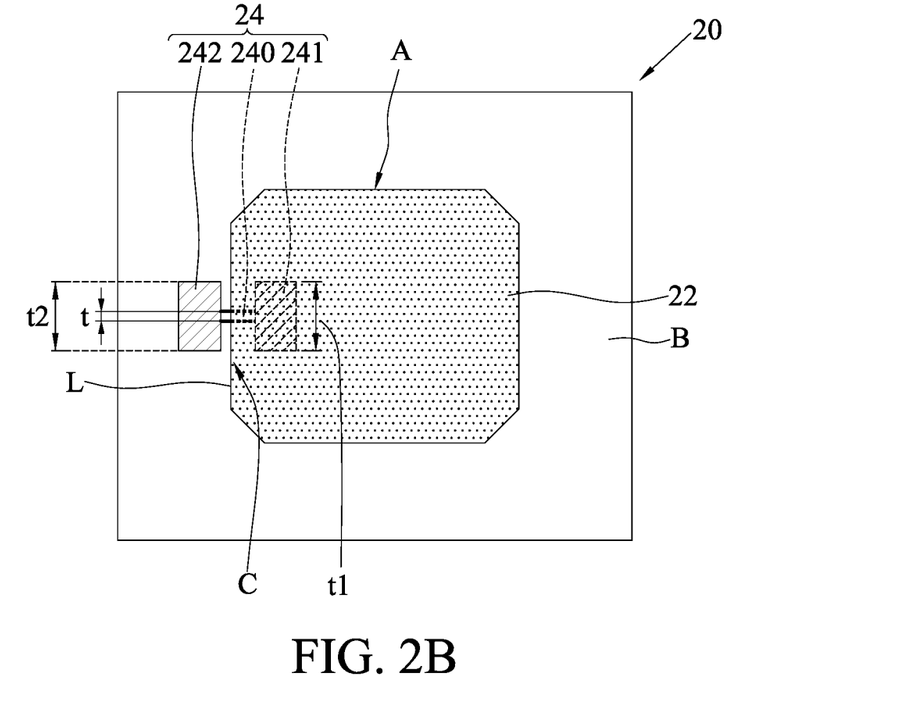
FIG. 2B is a schematic top view of the electronic package according to the present disclosure.

FIG. 2A and FIG. 2B are schematic views illustrating an electronic package 2 according to the present disclosure. As shown in FIG. 2A, the electronic package 2 includes a substrate structure 2a, at least one electronic element 21 and an encapsulation layer 22 covering the electronic element 21, wherein the substrate structure 2a includes a substrate body 20.

The substrate body 20 defines an encapsulation area A and a peripheral area B adjacent to each other on an outer surface of the substrate body 20, wherein the peripheral area B surrounds the encapsulation area A.

In one embodiment, the substrate body 20 is a package substrate having a core layer and a circuit layer or a coreless circuit structure, and the substrate body 20 includes at least one dielectric layer 201 and a circuit layer 200 bonded with the dielectric layer 201. For example, the circuit layer 200 is formed by a redistribution layer (RDL) manufacturing method, wherein the material for forming the circuit layer 200 is copper, and the material for forming the dielectric layer 201 is a dielectric material such as polybenzoxazole (PBO), polyimide (PI), prepreg (PP) and the like.

Furthermore, the outline of the encapsulation area A and the outline of the peripheral area B are substantially rectangular, and the corners of the encapsulation area A can be designed to be chamfered according to requirements.

The circuit layer 200 has a plurality of conductive traces 200a disposed in the encapsulation area A on the outermost surface of the substrate body 20. In addition, at least one functional circuit 24 extending from the encapsulation area A to the peripheral area B is formed on the outermost surface of the substrate body 20, wherein the functional circuit 24 defines a first block 241 located on the encapsulation area A, a second block 242 located on the peripheral area B and at least one wire 240 connected to the first block 241 and the second block 242, and wherein a width t of the wire 240 is less than a width t1 of the first block 241.

In one embodiment, the functional circuit 24 is a grounding circuit or a power circuit, and the width t of the wire 240 is 100 micrometers to 150 micrometers (μm) (130 μm is preferred). For example, the substrate body 20 defines a functional area C spanning the encapsulation area A and the peripheral area B on an outer surface thereof, so as to arrange the functional circuit 24 for grounding or power supplying.

Figure 2C:
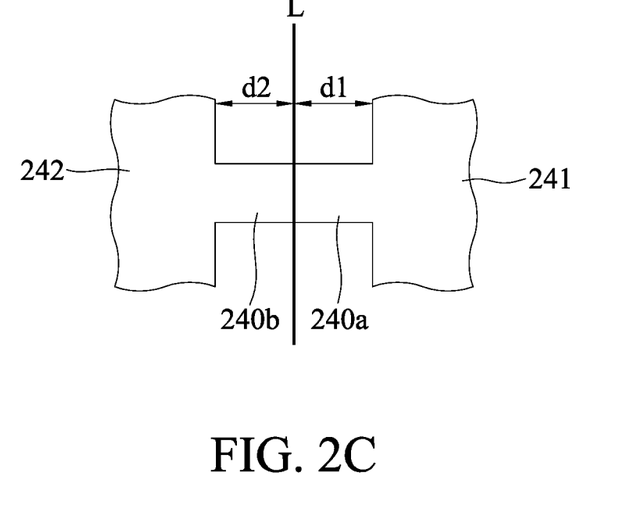
FIG. 2C is a schematic partial enlarged view of FIG. 2B.

Furthermore, the wire 240 spans the boundary line L (i.e., the molding line) at the junction between the encapsulation area A and the peripheral area B, so that the wire 240 defines a first line segment 240a arranged in the encapsulation area A and a second line segment 240b arranged in the peripheral area B based on the boundary line L, as shown in FIG. 2C. For example, the first line segment 240a is connected to the first block 241 and its length d1 (i.e., the distance between the first block 241 and the boundary line L) is 130 micrometers to 160 micrometers (μm) (preferably 140 μm), and the second line segment 240b is connected to the second block 242 and its length d2 (i.e., the distance between the second block 242 and the boundary line L) is 130 micrometers to 160 micrometers (μm) (preferably 140 μm). It should be understood that the length d1 of the first line segment 240a can be the same as or different from the length d2 of the second line segment 240b, and the length d1 and the length d2 are used to avoid the failure of exhaust due to the displacement of the substrate and the mold.

Figure 3A:
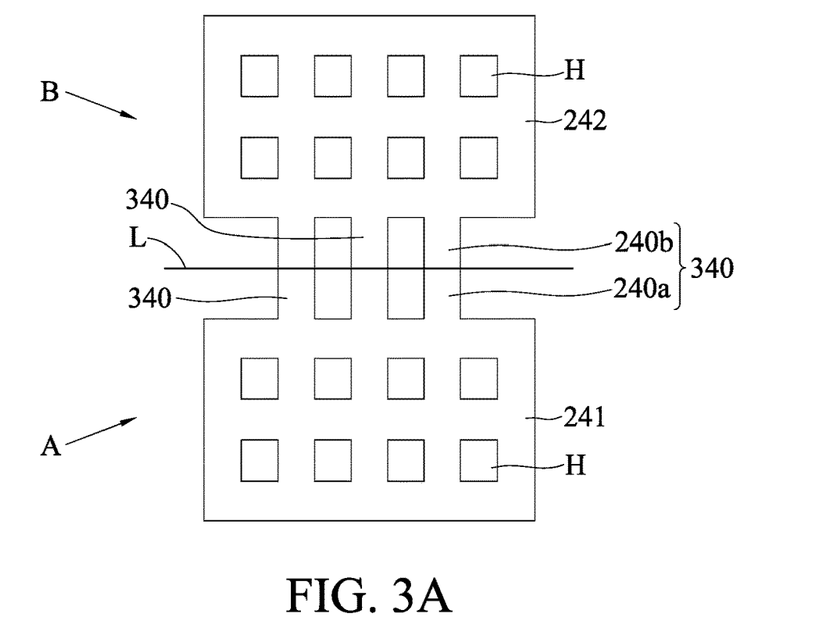
FIG. 3A is a schematic partial top view of another embodiment of FIG. 2B.
Figure 3B:
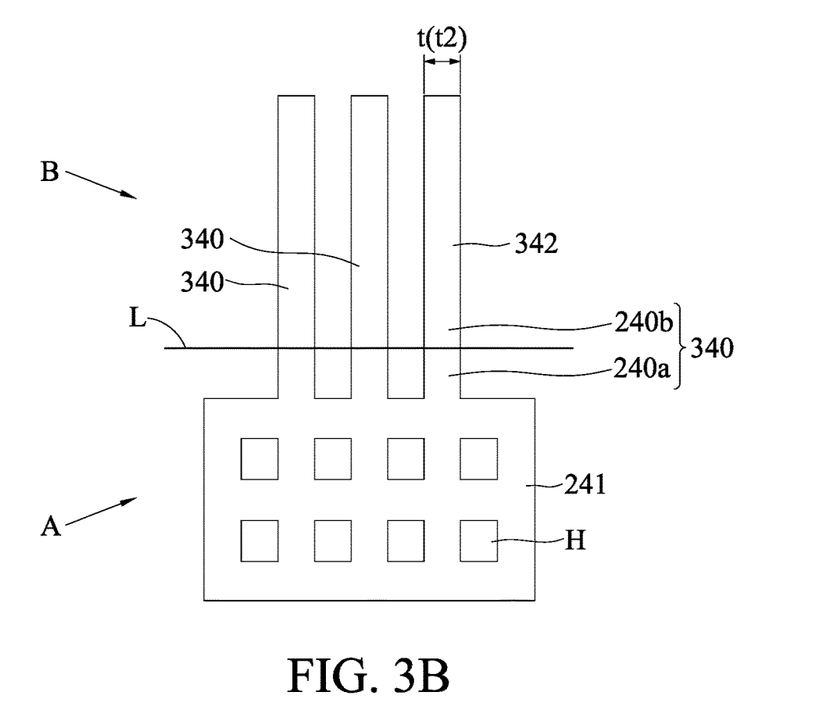
FIG. 3B and FIG. 3C are schematic partial top views of other embodiments of FIG. 3A.

In addition, the shapes of the first block 241 and the second block 242 may be the same (a rectangular sheet shape as shown in FIG. 2B or a grid shape as shown in FIG. 3A) or different (a grid-shaped first block 241 and a line-shaped second block 342 as shown in FIG. 3B), and the first block 241 and the second block 242 are connected via wires 240 and 340. For example, the grid shape forms a plurality of openings H on the sheet body, and preferably, the openings H are arranged in an array.

In addition, the number of the wires 340 can be determined according to the requirements. A plurality of wires 340 shown in FIG. 3A and FIG. 3B are not particularly limited, and the width t of the wire 240 can be less than the width t2 of the second block 242 (sheet shape) (as shown in FIG. 2B), or the width t of each of the wires 340 is equal to the width t2 of the second block 342 (line shape) (as shown in FIG. 3B). It should be understood that when the functional area C is configured with a plurality of wires 340, the width of each of the wires 340 can be the same or different, and the distance between each of the wires 340 can be set according to the requirements, and there is no particular limitation.

The electronic element 21 is an active element, a passive element or a combination of the active element and the passive element, and the active element is such as a semiconductor chip, and the passive element is such as a resistor, a capacitor, or an inductor.

In an embodiment, the electronic element 21 is, for example, an active element such as a graphics processing unit (GPU), a high bandwidth memory (HBM) or other types of semiconductor chips, which is electrically connected to the conductive traces 200a and the functional circuit 24 in a flip-chip manner via a plurality of conductive bumps 210 such as solder bumps, copper bumps or others.

Furthermore, the electronic element 21 and the conductive bumps 210 can be encapsulated by the encapsulation layer 22 at the same time. Alternatively, an underfill (not shown) can be formed between the electronic element 21 and the substrate structure 2a to cover the conductive bumps 210, and then the encapsulation layer 22 can be formed to encapsulate the underfill and the electronic element 21.

It should be understood that the electronic element 21 can be electrically connected to the conductive traces 200a and the functional circuit 24 in various ways, such as wire bonding, direct contact, or others, which are not limited to the above.

The encapsulation layer 22 is disposed on the entire area of the encapsulation area A but not on the peripheral area B, as shown in FIG. 2B, and the encapsulation layer 22 is an insulating material, such as polyimide (PI), dry film, an encapsulant such as epoxy resin, or molding compound, which can be formed on the substrate structure 2a by lamination or molding.

In one embodiment, an encapsulating process is to first dispose at least one electronic element 21 on the encapsulation area A of the substrate structure 2a (the substrate body 20), so that the electronic element 21 is electrically connected to the conductive traces 200a and the functional circuit 24, and the encapsulation layer 22 is then formed on the encapsulation area A to encapsulate the electronic element 21 by disposing the mold 9 on the substrate structure 2a. Thereafter, the mold 9 is removed to obtain the electronic package 2.

Therefore, in the electronic package 2 of the present disclosure, through the design of the substrate structure 2a, the functional circuit 24 is arranged on the boundary line L at the junction between the encapsulation area A and the peripheral area B with wires 240, 340 having a smaller width t, so that when the mold 9 is covered on the substrate structure 2a, a gap will be formed between the mold 9 and the functional circuit 24 (i.e., around the wire 240, 340) for an exhaust passage F, as shown in FIG. 2A. Therefore, compared with the prior art, when the encapsulation layer 22 is formed, the wires 240, 340 and their surroundings can be exhausted via the exhaust passage F, so as to increase the exhaust volume and reduce the occurrence of voids or overflows of the encapsulation layer 22, thereby avoiding problems such as popcorn or delamination of the electronic package 2.

Figure 3C:
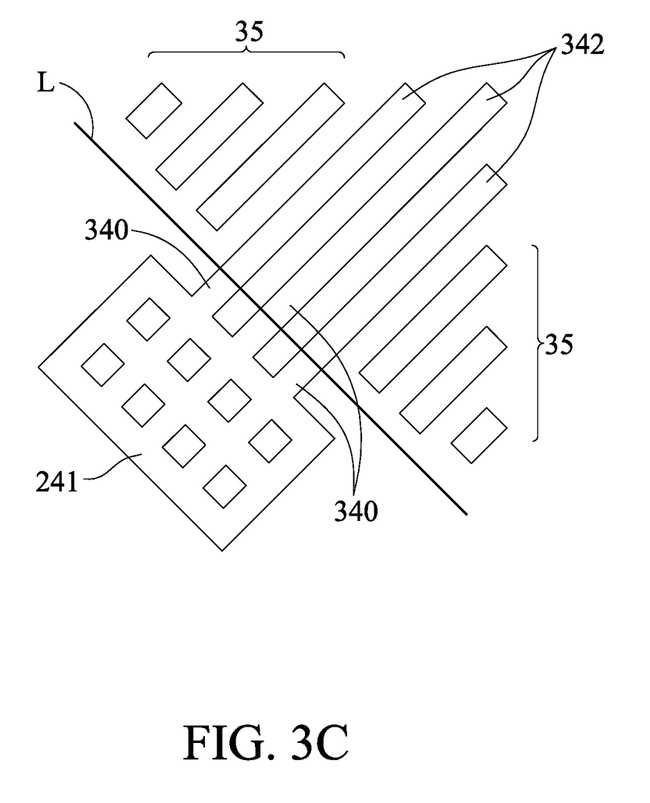

Furthermore, the substrate body 20 can be configured with metal layers 35 on the peripheral area B according to the requirements. As shown in FIG. 3C, the metal layers are free from being electrically connected to the electronic element 21, so that the substrate body 20 is prevented from warping by balancing the stress distribution, and serves for structural reinforcement. For example, the metal layers 35 may be in a line shape, which are correspondingly located on the functional area C and are spaced apart from the wires 340 (the second line segments) but not electrically connected to the wires 340 (the second line segments).

Figure 4:
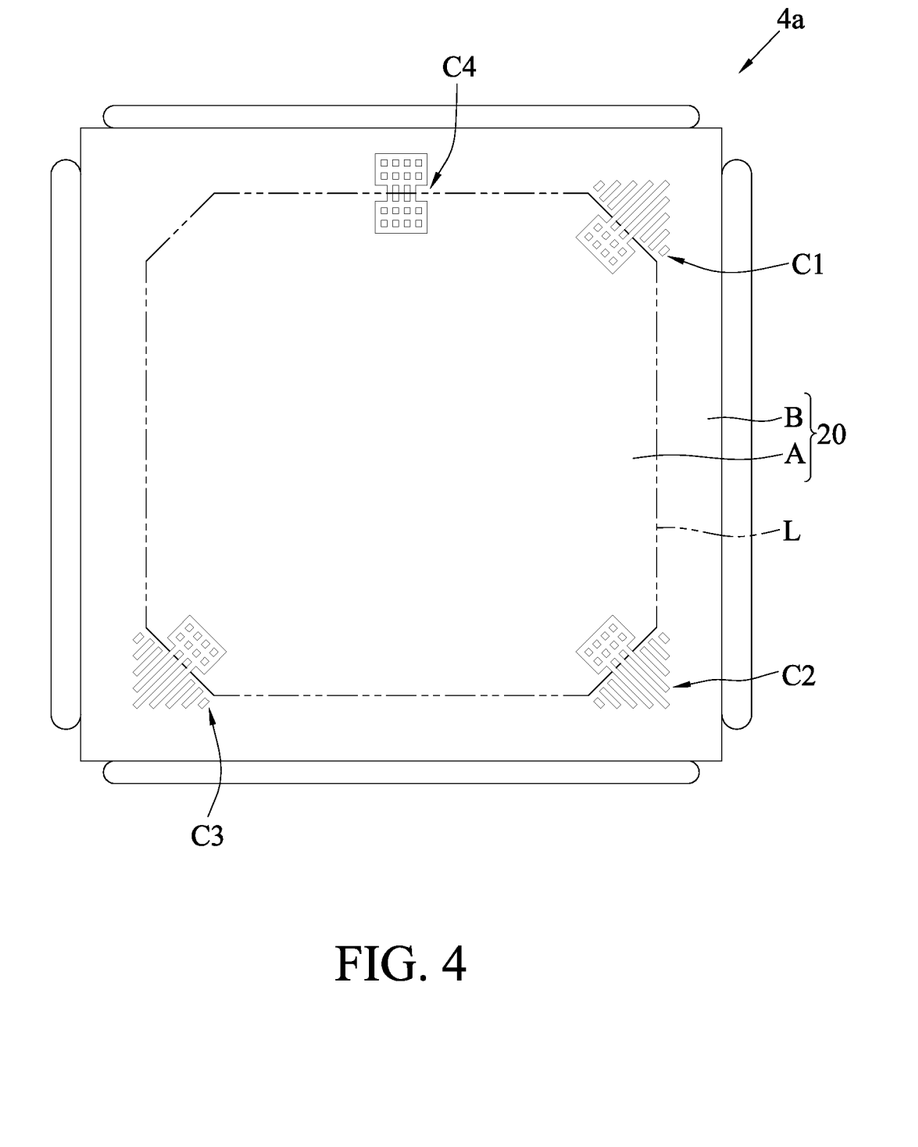
FIG. 4 is a schematic top view of another embodiment of the substrate structure according to the present disclosure.

In addition, as shown in FIG. 4, a substrate structure 4a of the present disclosure can design a plurality of functional areas C1, C2, C3, C4 (or functional circuits) on the substrate body 20 according to the requirements, such as the sides and corners of the boundary line L, to form more exhaust passages F, so that the process yield would be better. It should be understood that the conventional sheet-shaped grounding circuit can also be additionally configured, and the exhaust function will not be affected.

To sum up, in the electronic package and its substrate structure of the present disclosure, the position of the functional circuit in the functional area corresponding to the boundary of the mold is designed as a wire having a smaller width, so that when forming the encapsulation layer, an exhaust passage can be formed at and around the wire to increase the exhaust volume. Therefore, voids or overflows will not occur in the encapsulation layer, so as to avoid problems such as popcorn or delamination of the electronic package, thereby improving the production yield.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. A substrate structure, comprising:
    a substrate body defined with an encapsulation area and a peripheral area adjacent to each other on a surface of the substrate body; and
    at least one functional circuit formed on the substrate body and extending from the encapsulation area to the peripheral area, wherein the functional circuit is defined with a first block located on the encapsulation area, a second block located on the peripheral area, and at least one wire connecting the first block and the second block, and wherein the wire has a width less than a width of the first block.

2. The substrate structure of claim 1, wherein the width of the wire is 100 micrometers to 150 micrometers.

3. The substrate structure of claim 2, wherein the width of the wire is 130 micrometers.

4. The substrate structure of claim 1, wherein the width of the wire is less than or equal to a width of the second block.

5. The substrate structure of claim 1, wherein the wire spans a boundary line at a junction between the encapsulation area and the peripheral area, such that the wire defines a first line segment arranged in the encapsulation area and a second line segment arranged in the peripheral area based on the boundary line.

6. The substrate structure of claim 5, wherein the first line segment is connected to the first block, and the second line segment is connected to the second block.

7. The substrate structure of claim 5, wherein the first line segment has a length of 130 micrometers to 160 micrometers.

8. The substrate structure of claim 5, wherein the second line segment has a length of 130 micrometers to 160 micrometers.

9. The substrate structure of claim 1, wherein the functional circuit is a grounding circuit.

10. The substrate structure of claim 1, wherein the substrate body is configured with metal layers on the peripheral area, and wherein the metal layers are spaced apart from the wire and are free from being electrically connected to the wire.

11. An electronic package, comprising:
    the substrate structure of claim 1;
    an electronic element disposed on the encapsulation area and electrically connected to the functional circuit; and
    an encapsulation layer formed on the encapsulation area but not on the peripheral area.

12. The electronic package of claim 11, wherein the width of the wire is 100 micrometers to 150 micrometers.

13. The electronic package of claim 12, wherein the width of the wire is 130 micrometers.

14. The electronic package of claim 11, wherein the width of the wire is less than or equal to a width of the second block.

15. The electronic package of claim 11, wherein the wire spans a boundary line at a junction between the encapsulation area and the peripheral area, such that the wire defines a first line segment arranged in the encapsulation area and a second line segment arranged in the peripheral area based on the boundary line.

16. The electronic package of claim 15, wherein the first line segment is connected to the first block, and the second line segment is connected to the second block.

17. The electronic package of claim 15, wherein the first line segment has a length of 140 micrometers to 160 micrometers.

18. The electronic package of claim 15, wherein the second line segment has a length of 140 micrometers to 160 micrometers.

19. The electronic package of claim 11, wherein the functional circuit is a grounding circuit.

20. The electronic package of claim 11, wherein the substrate body is configured with metal layers on the peripheral area, and wherein the metal layers are spaced apart from the wire and are free from being electrically connected to the wire.

* * * * *